(12) United States Patent
Duong et al.

(10) Patent No.: US 8,694,285 B2
(45) Date of Patent: Apr. 8, 2014

(54) TURBINE BLADE BASE LOAD BALANCING

(75) Inventors: Loc Quang Duong, San Diego, CA (US); Xiaolan Hu, San Diego, CA (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 338 days.

(21) Appl. No.: 13/098,651

(22) Filed: May 2, 2011

(65) Prior Publication Data

US 2012/0283994 A1 Nov. 8, 2012

(51) Int. Cl.
G06F 17/50 (2006.01)

(52) U.S. Cl.
USPC .......................................................... 703/1

(58) Field of Classification Search
None
See application file for complete search history.

(56) References Cited

U.S. PATENT DOCUMENTS

| | | | |
|---|---|---|---|
| 4,260,331 | A | 4/1981 | Goodwin |
| 4,265,595 | A | 5/1981 | Bucy, Jr. |
| RE33,954 | E | 6/1992 | Honda et al. |
| 5,310,318 | A | 5/1994 | Lammas et al. |
| 6,302,651 | B1 | 10/2001 | Kildea et al. |
| 2005/0175461 | A1 | 8/2005 | Lagrange et al. |
| 2005/0175462 | A1 | 8/2005 | Lagrange et al. |
| 2006/0275125 | A1 | 12/2006 | Bibor et al. |
| 2008/0050238 | A1* | 2/2008 | Durocher et al. .......... 416/219 R |
| 2008/0095632 | A1* | 4/2008 | Phipps ....................... 416/219 R |
| 2009/0257877 | A1 | 10/2009 | Alvanos et al. |
| 2011/0068172 | A1 | 3/2011 | Liu |

OTHER PUBLICATIONS

Petrov, Advanced Analysis and Optimization of Nonlinear Resonance Vibrations in Gas-Turbine Structures with Friction and Gaps, Oct. 2010, Springer, pp. 297-307.*
Gallego et al., Multiscale computation of fretting wear at the blade/disk interface, 2009, Elsevier, pp. 708-718.*

* cited by examiner

*Primary Examiner* — Omar Fernandez Rivas
*Assistant Examiner* — Bernard E Cothran
(74) *Attorney, Agent, or Firm* — Carlson, Gaskey & Olds P.C.

(57) ABSTRACT

An example method of designing blade lobes of a turbomachine blade and corresponding disk lobes includes determining contact areas between the blade lobes on a blade model and the disk loads on a disk model when the turbomachine blade is in a loaded position. The method adjusts the blade lobes, the disk lobes, or both, so that gaps are established between the blade lobes and the disk lobes at the contact areas when the turbomachine blade is in an unloaded position. The size of the gaps varies.

18 Claims, 11 Drawing Sheets

TURBINE BLADE BASE LOAD BALANCING

BACKGROUND

This disclosure relates generally to a blade and a disk within a turbomachine. More particularly, this disclosure relates to redistributing loads on the disk and a base of the blade by adjusting the interface between the disk and the base of the blade.

Turbomachines are well known. Turbomachines typically include multiple rotor assemblies within a fan assembly, a compressor section, and a turbine section. The rotor assemblies each include an array of blades circumferentially distributed about a rotational axis of the turbomachine. The blades each include a base section, a platform section, and an airfoil section that extends radially outwardly from the platform section.

During assembly, the base section is received within a recess established within an outer rim of the disk. The base has multiple lobes that contact areas of the disk to limit radial movement of the blade relative to the disk. Such a base is sometimes referred to as a fir-tree base. As the turbomachine reaches an operating speed, centrifugal forces cause the base to move within the recess from an unloaded position and a loaded position relative to the disk. The blades are locked into place axially with bolts, locking pins, etc.

Referring to the prior art arrangement of FIG. 1, a base 1 of a blade is received within a recess established within a disk 2. The base 1 has a plurality of lobes $3a$-$3f$. In the unloaded position shown, the base 1 is biased toward a rotational axis in a direction D, and inwardly facing surfaces of the lobes $3a$-$3f$ press against the disk 2. When the base 1 is in a loaded position, the base 1 is biased away from the rotational axis and outwardly facing surfaces of the lobes $3a$-$3f$ press against the disk at a respective contact area $4a$-$4$-$f$.

In the unloaded position, there are gaps $5a$-$5f$ between the lobes $3a$-$3f$ and the disk 2 at the contact area $4a$-$4$-$f$. In the prior art, the size of the gaps $5a$-$5f$ does not vary from side to side. In the prior art, some of the lobes $3a$-$3f$ experience high loads that can fracture or otherwise damage the base 1 or the disk 2 when the blade is in the loaded position.

SUMMARY

An example method of designing blade lobes of a turbomachine blade and corresponding disk lobes includes determining contact areas between the blade lobes on a blade model and the disk loads on a disk model when the turbomachine blade is in a loaded position. The method adjusts the blade lobes, the disk lobes, or both, so that gaps are established between the blade lobes and the disk lobes at the contact areas when the turbomachine blade is in an unloaded position. The size of the gaps varies.

An example method of designing blade lobes of a turbomachine blade and corresponding disk lobes includes spacing a radially outer lobe of a blade base away from a first corresponding contact area of a disk a first distance and spacing a radially middle lobe of a blade base away from a second corresponding contact area of the disk a second distance. The method spaces a radially inner lobe of a blade base away from a third corresponding contact area of the disk a third distance. The first distance is greater than the second distance. The second distance is greater than the third distance. The blade is in an unloaded position during the spacing.

An example blade assembly includes a base of a blade that is configured to be installed within a recess and moved radially within the recess between a loaded position and an unloaded position. Lobes on the base each have a blade contact area that contacts a corresponding disk contact area on the disk when the base is in the loaded position. Gaps are established between the blade contact areas and the disk contact areas when the base is in the unloaded position. The size of the gaps varies.

DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

Figure 1:
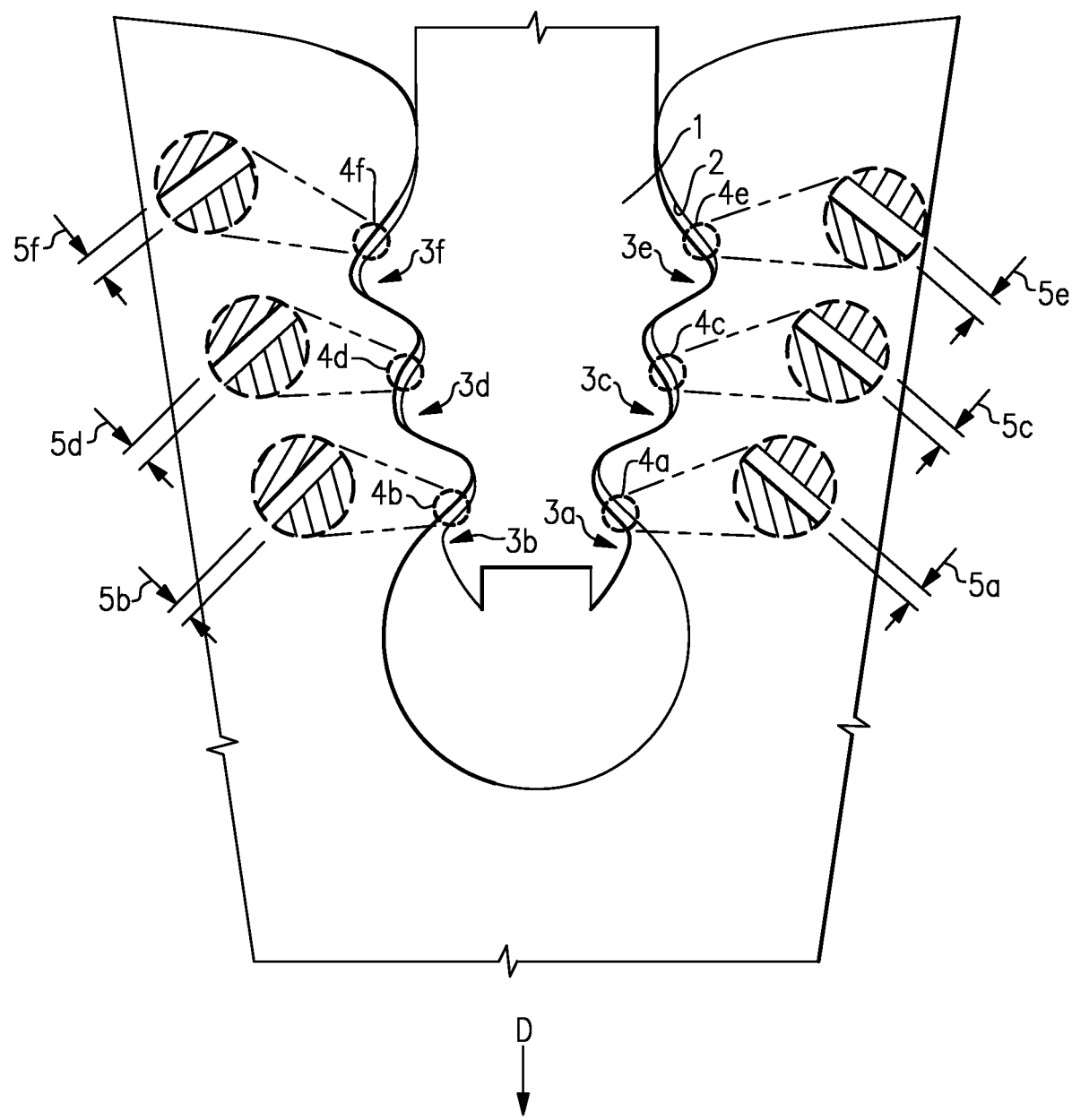
FIG. 1 shows a PRIOR ART base of a blade in an unloaded position.
Figure 2:
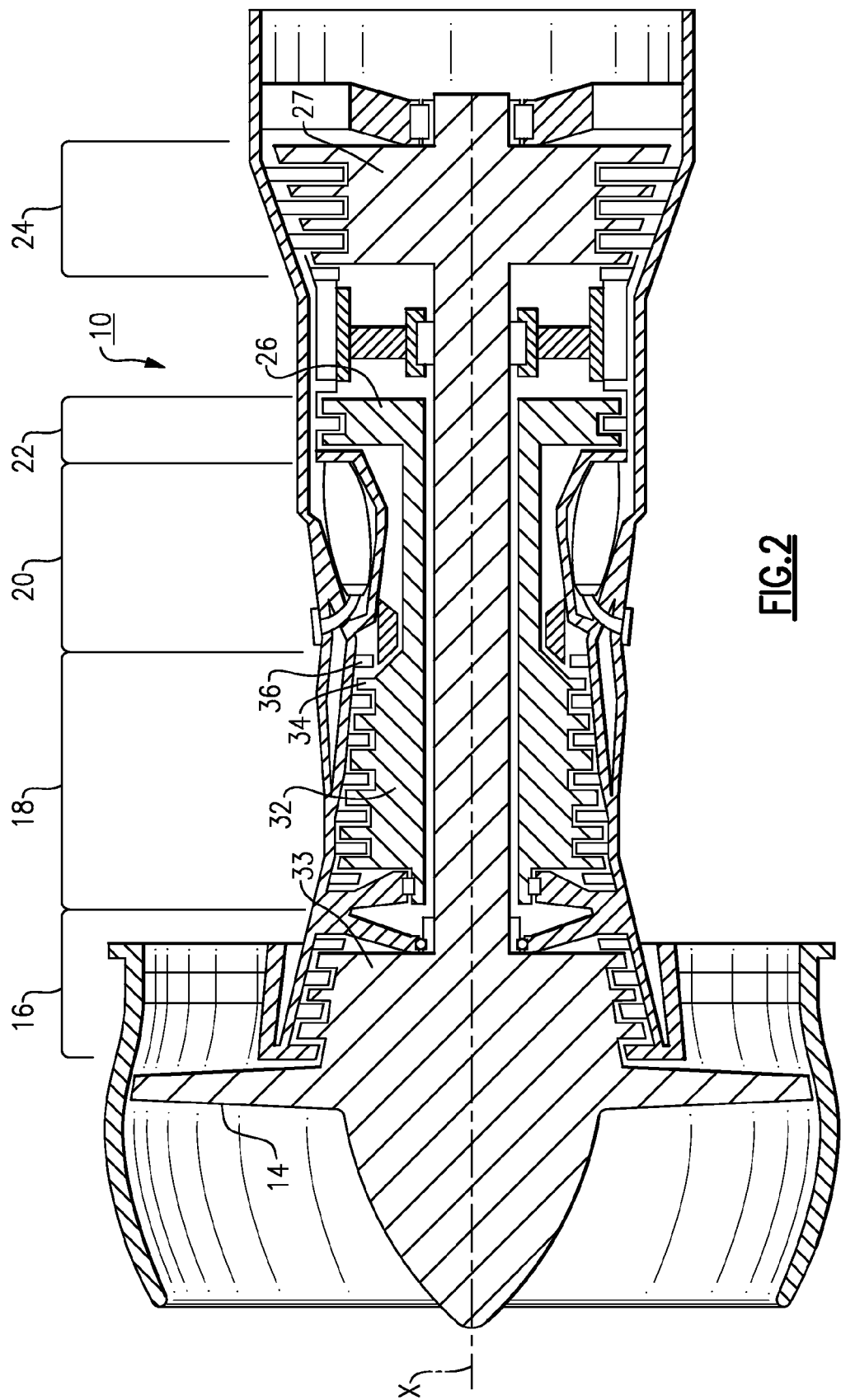
FIG. 2 shows an example turbomachine.
Figure 3:
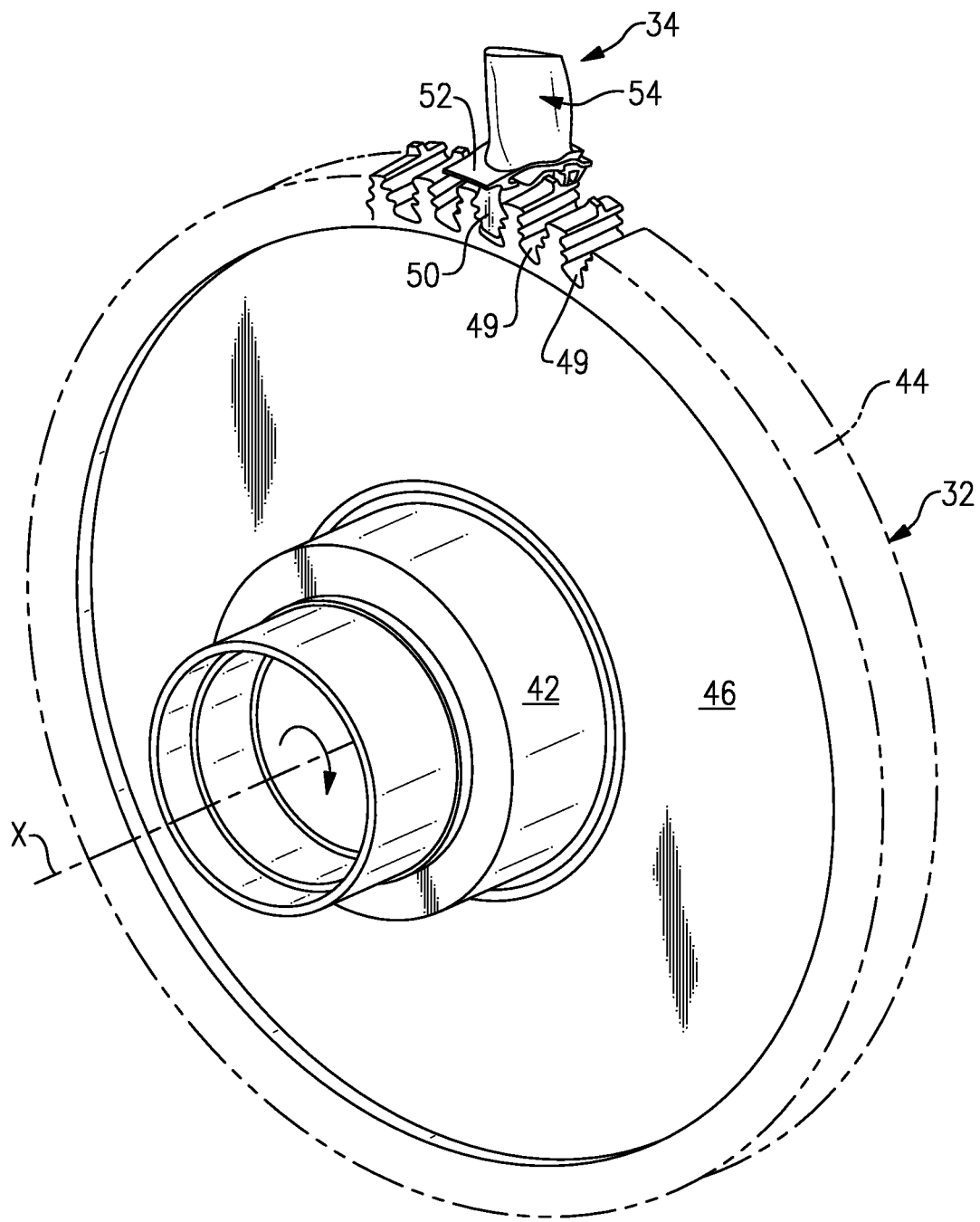
FIG. 3 shows a rotor assembly from the FIG. 2 turbomachine.

Referring to FIGS. 2-3, an example turbomachine, such as a gas turbine engine 10, is circumferentially disposed about an axis X. The example gas turbine engine 10 includes a fan assembly 14, a low pressure compressor section 16, a high pressure compressor section 18, a combustion section 20, a high pressure turbine section 22, and a low pressure turbine section 24.

During operation, air is compressed in the low pressure compressor section 16 and the high pressure compressor section 18. The compressed air is then mixed with fuel and burned in the combustion section 20. The products of combustion are expanded across the high pressure turbine section 22 and the low pressure turbine section 24.

The high pressure compressor section 18 and the low pressure compressor section 16 include rotor disks 32 and 33, respectively, that rotate about the axis 12. The high pressure compressor section 18 and the low pressure compressor section 16 also include alternating rows of rotating blades 34 and static vanes 36.

The high pressure turbine section 22 and the low pressure turbine section 24 each include rotor disks 26 and 27, respectively, which rotate in response to expansion to drive the high pressure compressor section 18 and the low pressure compressor section 16. The example rotors 26 and 27 also include rotating blades and static vanes.

The examples described in this disclosure are not limited to rotors of the two spool gas turbine architecture described.

That is, these examples may be used in other architectures, such as a single spool axial design, a three spool axial design, and still other architectures. Further, there are various types of gas turbine engines, and other turbomachines, that would benefit from the examples disclosed herein.

Figure 4:
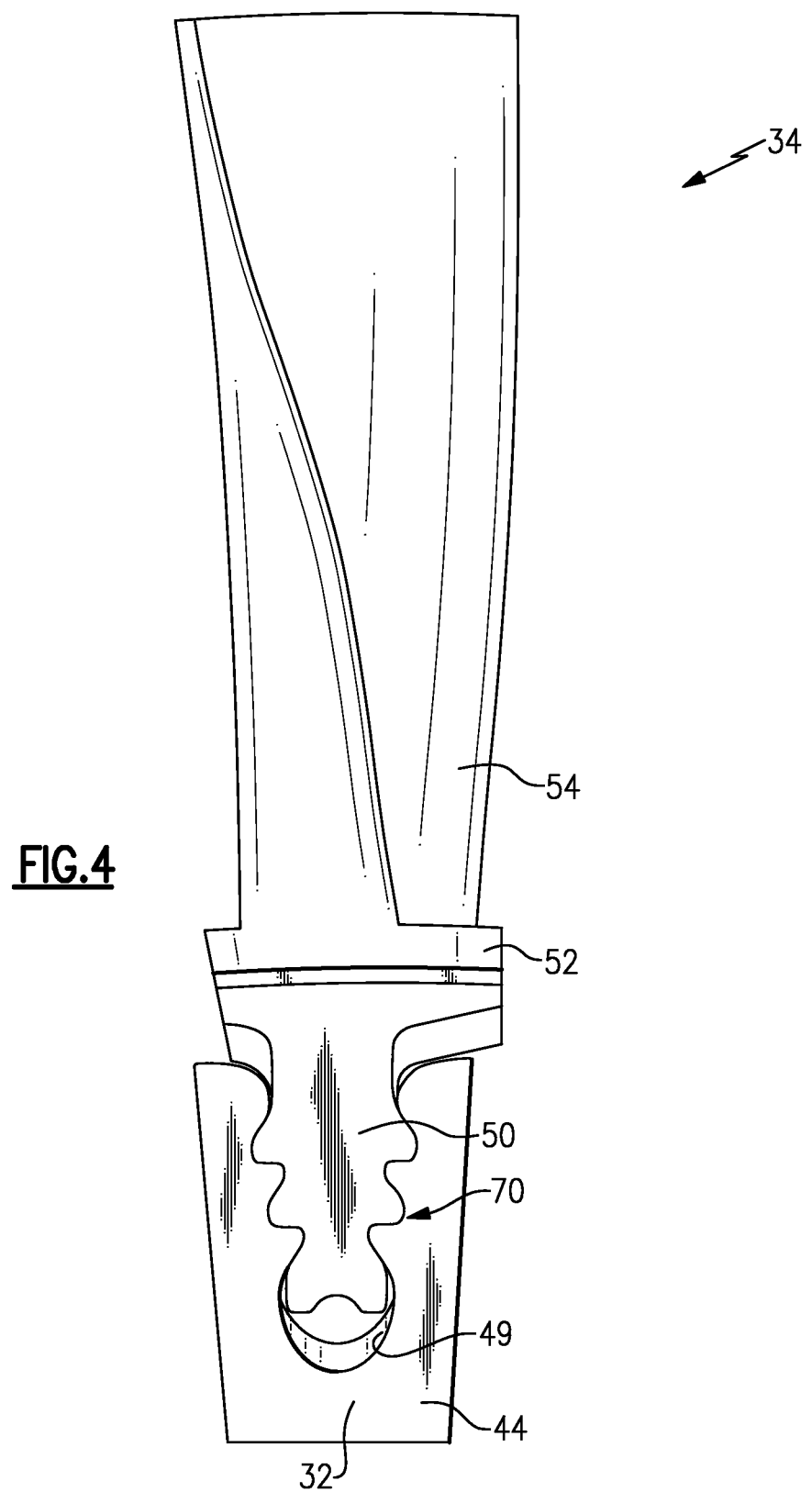
FIG. 4 shows a close-up view of a blade and a portion of the disk from the FIG. 3 rotor assembly.

Referring now to FIGS. 3-4 with continuing reference to FIG. 2, the rotor disk 32 from the high pressure compressor section 18 of the gas turbine engine 10 includes a plurality of the blades 34 that are circumferentially disposed about the axis X. The disk 32 generally includes a hub 42, a rim 44, and a web 46 extending from the hub 42 to the rim 44. Each blade 34 includes a base 50, a platform section 52, and an airfoil section 54. The base 50 is configured to be received within a recess 49 established in the rim 44 of the disk 32. The base 50 meets the disk 32 at an interface 70, which generally represents the areas of potential contact between the base 50 and the disk 32.

Figure 5:
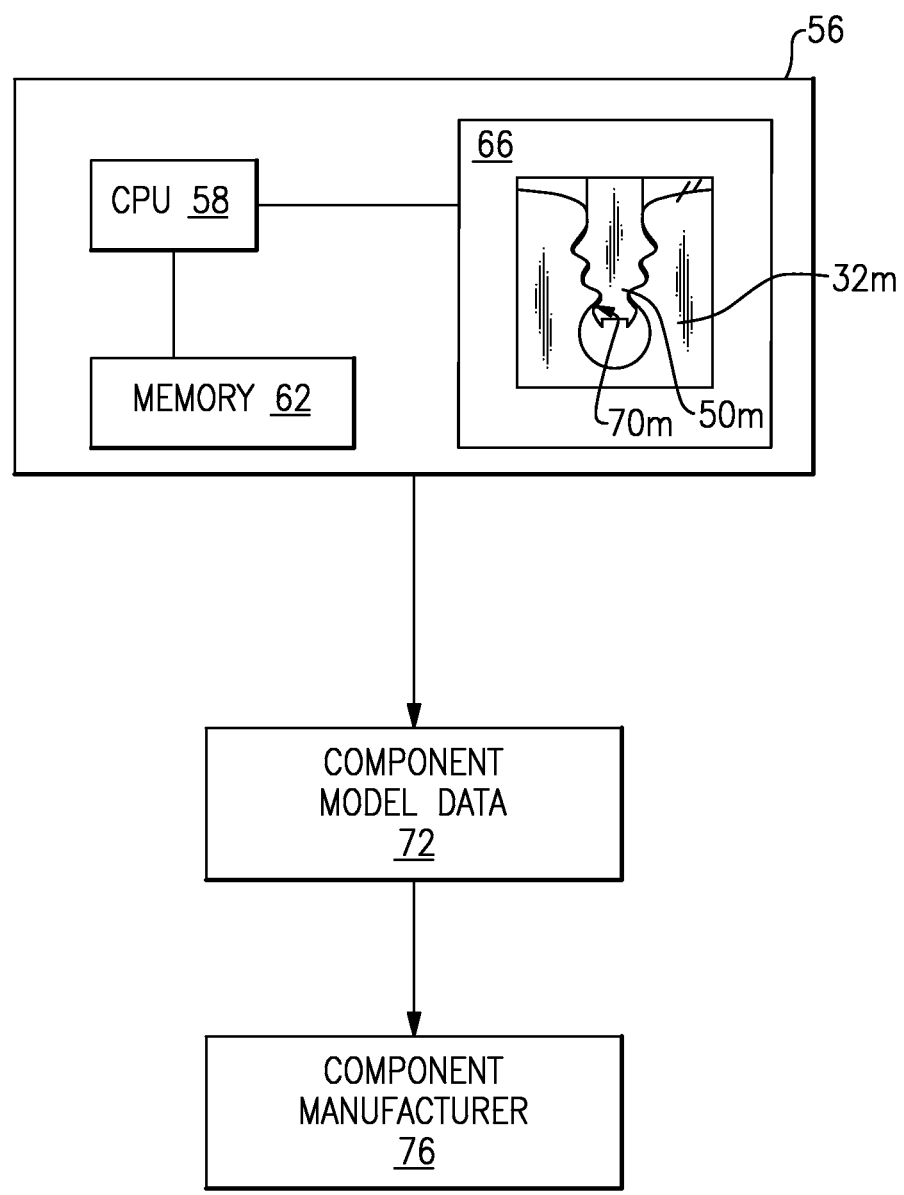
FIG. 5 schematically shows a system for designing the FIG. 4 blade and disk.

Referring now to FIG. 5 with continuing reference to FIG. 4, a modeling computer 56 is used, in this example, to design the blade 34 and the disk 32. The modeling computer 56 includes a processor 58, a memory portion 62, and a display 66. In the modeling computer 56, the base 50 of the blade 34 is represented by a base model $50_m$. Similarly, the disk 32 is represented by a disk model $32_m$. The base model $50_m$ and the disk model $32_m$ meet at an interface $70_m$.

In this example, a designer using the modeling computer 56 manipulates the surfaces and sizes of the base model $50_m$ and the disk model $32_m$. When the interface $70_m$ between the base model $50_m$ and the disk model $32_m$ is in a desired position, data is outputted from the modeling computer 56 as component model data 72 to a component manufacturer 76. The component manufacturer 76 then generates the base 50 and the disk 32. The interface 70 between the base 50 and the disk 32 is the same as the interface $70_m$ between the base model $50_m$ and the disk model $32_m$.

It should be noted that various computing devices can be used to implement various functions of the modeling computer 56. In terms of hardware architecture, the computing devices can include the processor 58, memory 62, and one or more input and/or output (I/O) device interface(s) that are communicatively coupled via a local interface. The local interface can include, for example but not limited to, one or more buses and/or other wired or wireless connections. The local interface may have additional elements, such as controllers, buffers (caches), drivers, repeaters, and receivers to enable communications. Further, the local interface may include address, control, and/or data connections to enable appropriate communications among the aforementioned components.

The example processor 58 may be a hardware device for executing software, particularly software stored in memory. The processor can be a custom made or commercially available processor, a central processing unit (CPU), an auxiliary processor among several processors associated with the computing device, a semiconductor based microprocessor (in the form of a microchip or chip set) or generally any device for executing software instructions.

The example memory 62 can include any one or combination of volatile memory elements (e.g., random access memory (RAM, such as DRAM, SRAM, SDRAM, VRAM, etc.)) and/or nonvolatile memory elements (e.g., ROM, hard drive, tape, CD-ROM, etc.). Moreover, the memory 62 may incorporate electronic, magnetic, optical, and/or other types of storage media. Note that the memory 62 can also have a distributed architecture, where various components are situated remotely from one another, but can be accessed by the processor.

The software in the memory 62 may include one or more separate programs, each of which includes an ordered listing of executable instructions for implementing logical functions. A system component embodied as software may also be construed as a source program, executable program (object code), script, or any other entity comprising a set of instructions to be performed. When constructed as a source program, the program is translated via a compiler, assembler, interpreter, or the like, which may or may not be included within the memory.

The Input/Output devices that may be coupled to system I/O Interface(s) may include input devices, for example but not limited to, a keyboard, mouse, scanner, microphone, camera, proximity device, etc. Further, the Input/Output devices may also include output devices, for example but not limited to, a printer, display, etc. Finally, the Input/Output devices may further include devices that communicate both as inputs and outputs, for instance but not limited to, a modulator/demodulator (modem; for accessing another device, system, or network), a radio frequency (RF) or other transceiver, a telephonic interface, a bridge, a router, etc.

When the modeling computer 56 is in operation, the processor 58 can be configured to execute software stored within the memory 62, to communicate data to and from the memory 62, and to generally control operations of the modeling computer 56 pursuant to the software. Software in the memory 62, in whole or in part, is read by the processor 58, perhaps buffered within the processor 58, and then executed.

Figure 6A:
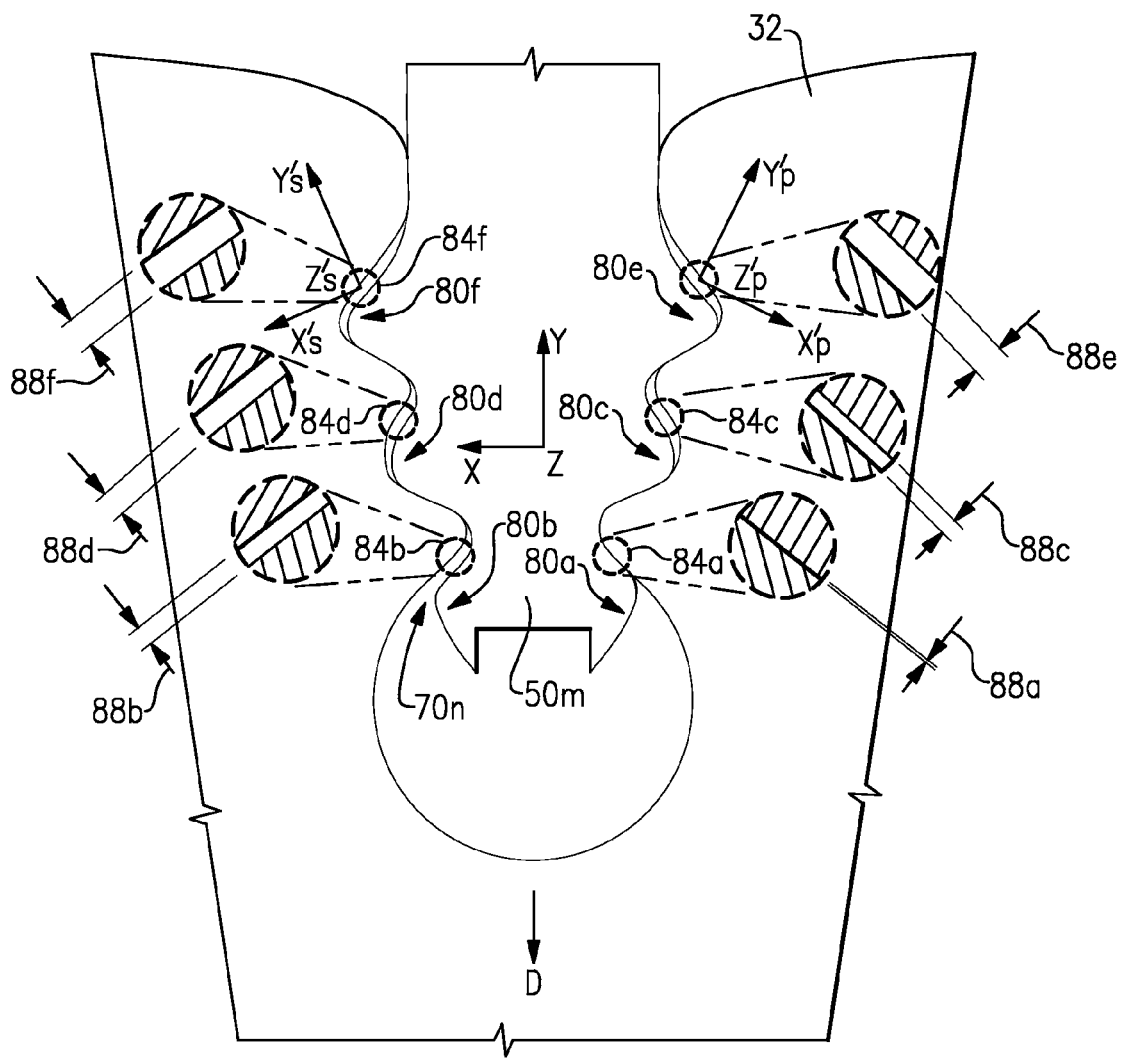
FIG. 6A shows a model of the base of the FIG. 4 blade in an unloaded position.
Figure 6B:
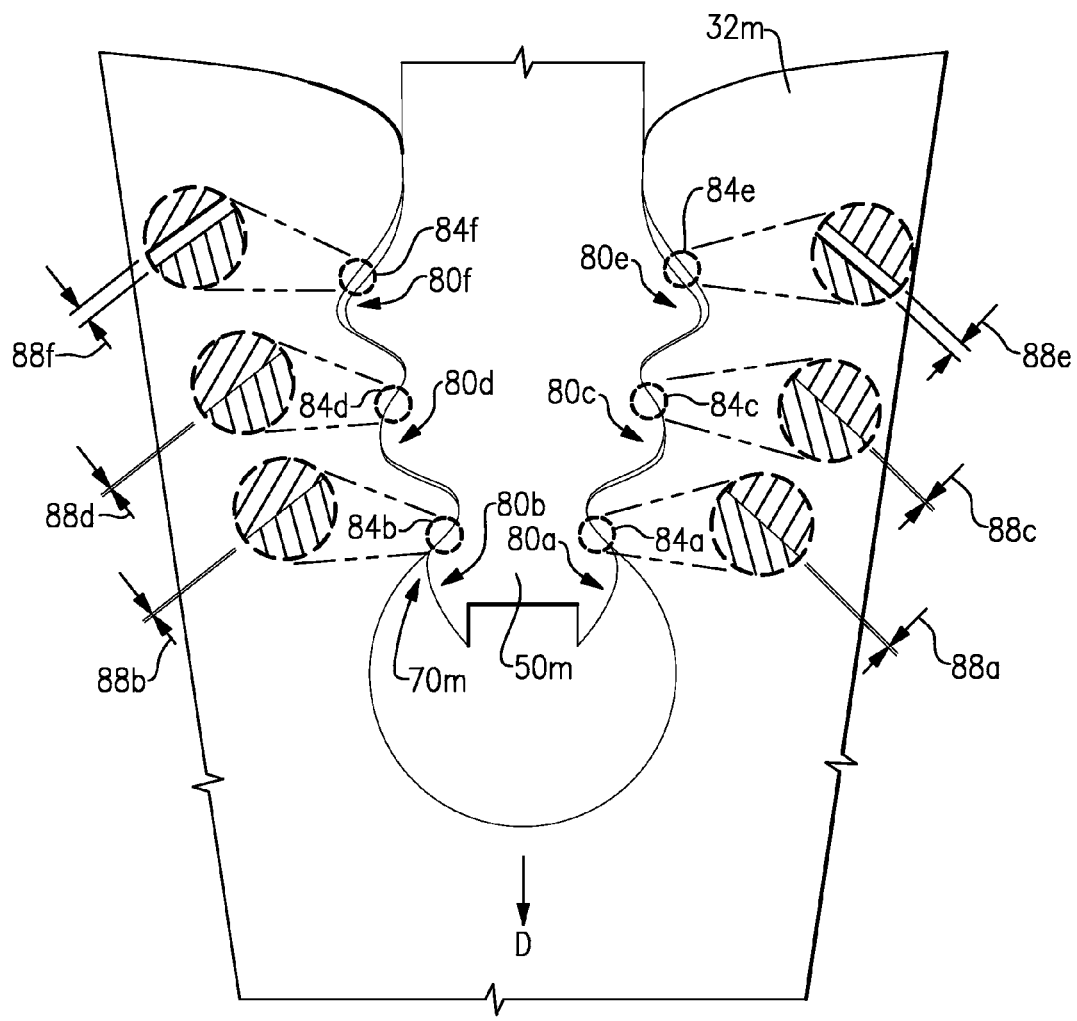
FIG. 6B shows a model of the base of the FIG. 4 blade in a position between an unloaded position and a loaded position.
Figure 6C:
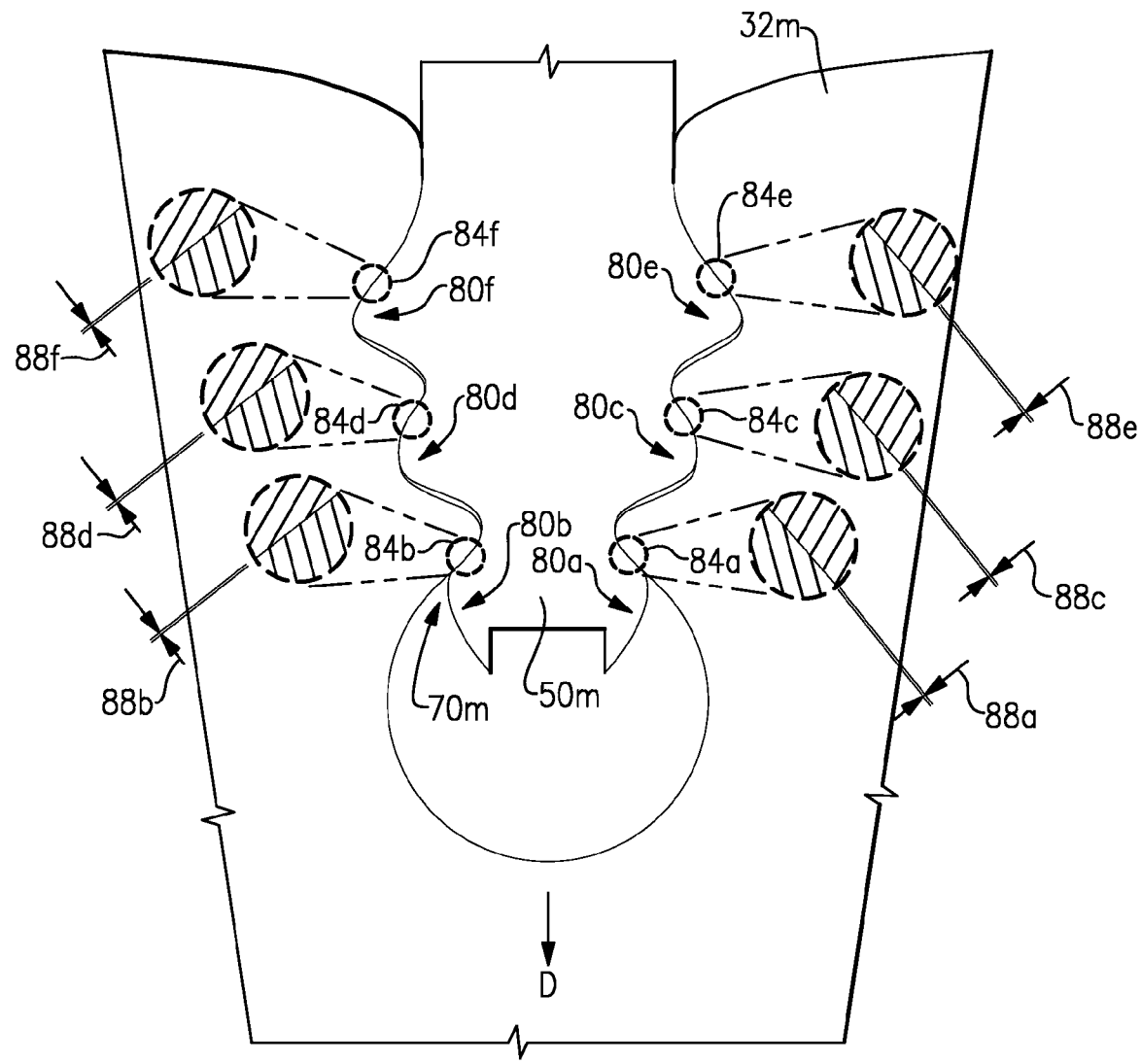
FIG. 6C shows a model of the base of the FIG. 4 blade in a loaded position.

Referring now to FIGS. 6A-6C with continuing reference to FIGS. 4-5, the base model $50_m$ is a fir-tree in this example, and includes a plurality of lobes 80a-80f configured to selectively contact the disk model $32_m$ at contact areas 84a-84f. In this example, the contact areas 84a-84f between the base model $50_m$ and the disk model $32_m$ represent the areas of contact between the base 50 and the disk 32 when the blade 34 is a loaded position and biased outwardly in a direction opposite the direction D. The blade 34 is in the loaded position when the gas turbine engine 10 is fully operating, and is unloaded when the gas turbine engine 10 is not operating, for example.

In the unloaded position (FIG. 6A), the base model $50_m$ is representing the base 50 when the base 50 is biased radially inwardly in the direction D. In the unloaded position, an outwardly facing surface of the lobe 80a contacts the disk model $32_m$ at contact area 84a, and inwardly facing surfaces of the lobes 80c-80f contact the disk model $32_m$.

FIG. 6B shows the base model $50_m$ in a position between the unloaded position of FIG. 6A and the loaded position of FIG. 6C. The position of FIG. 6B represents the blade 34 during startup of the gas turbine engine 10 (FIG. 2), when the blade 34 is moving toward the loaded position of FIG. 6C, for example. In FIG. 6B, the lobes 80a-80d of the base model $50_m$ contact the disk model $32_m$ at contact areas 84a-84d, respectively. Notably, the lobes 80e-80f do not contact the disk model $32_m$ at the contact areas 84e-84f in FIG. 6B.

In the loaded position of FIG. 6C, the lobes 80a-80f each contact the disk model $32_m$ at contact areas 84a-84f, respectively. The position of the base model $50_m$ in FIG. 6C represents the position of the base when the gas turbine engine 10 is fully operating.

The designer utilizing the modeling computer 56 manipulates the surfaces of the base model $50_m$, the disk model $32_m$, or both, to adjust when the lobes 80a-80d of the base 50 (that is created from the base model $50_m$) will contact the disk 32 (that is created from the disk model $38_m$) at the contact areas 84a-84f.

In this example, the designer generally determines how to adjust the surfaces of the base model $50_m$, the disk model $32_m$, or both, by first moving the base model $50_m$ to the unloaded position of FIG. 6A. The surfaces of the base model $50_m$, the disk model $32_m$, or both, are then manipulated to adjust the size of the gaps $88a$-$88f$ between the lobes $80a$-$80f$ and the disk model $32_m$ at the contact areas $84a$-$84f$.

In this example, to establish the size of the gaps $88a$-$88f$, the designer first establishes a local coordinate system associated with the suction side $(X'_s, Z'_s)$, and a local coordinate system associated with the pressure side $(X'_p, Y'_p, Z'_p)$. The local coordinate systems are transformations of a global coordinate system $(X, Y, Z)$ utilized by the modeling computer 56.

A transformation matrix $[R]$ is used to provide the local coordinate system $(X'_s, Y'_s, Z'_s)$ based on the global coordinate system $(X, Y, Z)$. In this example:

$$[R] = \begin{bmatrix} \cos\theta & \sin\theta & 0 & x \\ -\sin\theta & \cos\theta & 0 & y \\ 0 & 0 & 1 & z \\ 0 & 0 & 0 & 1 \end{bmatrix}$$

Another, similar, transformation matrix (not shown) relates the local coordinate system $(X'_p, Y'_p, Z'_p)$ to the global coordinate system $(X, Y, Z)$.

A person having skill in this art would understand the global coordinate system $(X, Y, Z)$ associated with the base model $50_m$ positioned within the disk model $32_m$, and how to establish local coordinate systems based on the global coordinate system using the transformation matrix $[R]$.

After establishing local coordinate systems $(X'_s, Y'_s, Z'_s)$ and $(X'_p, Y'_p, Z'_p)$, the operator adjusts surfaces of the base model $50_m$, the disk model $32_m$, or both. The scale of the adjustments is made based on the local coordinate systems $(X'_s, Y'_s, Z'_s)$ and $(X'_p, Y'_p, Z'_p)$. In this example, the surfaces are adjusted so that the gaps $88a$-$88f$ are asymmetric when the base model $50_m$ is in the unloaded position. More specifically, the surfaces are adjusted so that the gaps $88e$ and $88f$ for the radially outer lobes $80f$ and $80e$ are larger than the gaps $88c$ and $88d$ for the radially middle lobes $80c$ and $80d$, which are larger than the gaps $88a$ and $88b$ for the radially inner lobes $80a$ and $80b$.

In one example, the operator establishes appropriate sizes for the gaps $88a$-$88f$ utilizing an equation associated with each of the gaps $88a$-$88f$. In these equations, the following nomenclature is used:

δ=displacement in $Y'_s$ direction on the suction side (or displacement in the $Y'_p$ direction on the pressure side). The displacement is normal to the contact areas $84a$-$84f$ k=equivalent stiffness of the respective one of the lobes $80a$-$80f$ M=weight of the blade 34 r=radius from an overall center of gravity of the blade 34 to the axis of rotation X F=estimated total force on the blade in the direction $Y'_s$ on the suction side (or total force in the $Y'_p$ direction on the pressure side) when the blade 34 is in a loaded position ω=rotor angular velocity t=time As can be appreciated, the lobes $80a$-$80f$ are displaced relative to other portions of the base 50 as the base 50 moves to the loaded position. In this example, $\delta_{10}$ represents the displacement of the lobes $80a$ and $80b$ when the lobes $80b$-$80f$ are not in contact with the disk 32.

When the lobes $80a$-$80d$ contact the disk 32 and the lobes $80e$-$80f$ are spaced from the disk 32 (FIG. 6B), $\delta_{12}$ represents the displacement of the lobes $80a$-$80b$ and $\delta_{22}$ represents the displacement of the lobes $80c$-$80d$.

When the lobes $80a$-$80f$ each contact the disk 32, $\delta_{13}$ represents the displacement of the lobes $80a$-$80b$, $\delta_{23}$ represents the displacement of the lobes $80c$-$80d$, and $\delta_{33}$ represents the displacement of the lobes $80e$-$80f$.

Variables $\delta_{1A}$, $\delta_{2A}$, and $\delta_{3A}$ are compared to the displacements $\delta_{10}$, $\delta_{12}$, $\delta_{13}$, $\delta_{22}$, $\delta_{23}$, and $\delta_{33}$. The variables $\delta_{1A}$, $\delta_{2A}$, and $\delta_{3A}$ represent the total displacement at the each of the radial positions for the lobes $80a$-$80f$ and correspond to a limit stress of each of these lobes.

As shown in the following equations, the individual displacements of the lobes $80a$-$80f$ at the contact points are less than or equal to the limit stress:

For lobes $80a$-$80b$: $\delta_{10}+\delta_{12}+\delta_{13} \leq \delta_{1A}$ \hfill (1)

For lobes $80c$-$80d$: $\delta_{22}+\delta_{23} \leq \delta_{2A}$ \hfill (2)

For lobes $80e$-$80f$: $\delta_{33} \leq \delta_{3A}$ \hfill (3)

In this example, $\delta_{1A}$ represents the total potential displacement at the lobes $80a$ and $80b$. That is, $\delta_{1A}$ corresponds to the displacement of the lobes $80a$ and $80b$ when the lobes $80a$ and $80b$ are at their allowable limit stress.

In this example, $\delta_{10}$ represents the displacement of the bottom lobes $80a$ and $80b$ as the rotational speed of the blade 34 increases from zero to $\omega_1$. At this speed, the lobes $80c$ and $80d$ contact the disk 32 and start to carry load.

Accelerating the blade 34 further moves the rotational speed toward $\omega_2$, which is a higher rotational speed than $\omega_1$. In this example, $\omega_2$ is the rotational speed where the lobes $80e$ and $80f$ also contact the disk 32. From $\omega_1$ to $\omega_2$, the radial displacements of the lobes $80a$ and $80b$ at the contact points $84a$ and $84b$ is $\delta_{12}$, and the radial displacements of the lobes $80c$ and $80d$ at the contact points $84c$ and $84d$ is $\delta_{22}$.

Accelerating the blade 34 further moves the rotational speed toward $\omega_n$, which is a higher rotational speed than $\omega_2$ and corresponds to a full operating speed. At the full operating speed $\omega_n$, the radial displacement of the lobes $80a$ and $80b$ at the contact points $84a$ and $84b$ is $\delta_{13}$, the radial displacement of the lobes $80c$ and $80d$ at the contact points $84c$ and $84d$ is $\delta_{23}$, and the radial displacement of the lobes $80e$ and $80f$ at the contact points $84e$ and $84f$ is $\delta_{33}$.

Load sharing factors $(LS_i)$ are also calculated for the lobes $80a$-$80f$. The net forces carried by the lobes $80a$-$80f$ are evaluated at the full speed of the engine 10. In this calculation, $F_1$ is the net force carried by the lobes $80a$-$80b$, $F_2$ is the net force carried by the lobes $80c$-$80d$, and $F_3$ is the net force carried by the lobes $80e$-$80f$. The computing device is configured to calculate these net forces. Then the total load and the load sharing factors are:

$$\frac{F_1}{F} = LS_1; \quad \frac{F_2}{F} = LS_2; \quad \frac{F_3}{F} = LS_3$$

In some examples, the load distribution is not the same on the pressure and suction sides of the blade 34. Thus:

$$F_L - F_R = \Delta F$$

As can be appreciated, a designer using the above techniques is left with seven unknown variables: $\omega_1$, $\omega_2$, $\delta_{10}$, $\delta_{12}$, $\delta_{13}$, $\delta_{22}$, and $\delta_{23}$. In one example, these unknowns are determined using the following techniques.

For example, from equations (1), (2) and (3), and the load sharing factors, the corresponding forces may be established using the following equations:

$$F_1 = k_1 \delta_{1A} \quad (4)$$

$$F_2 = k_2 \delta_{2A} \quad (5)$$

$$F_3 = k_3 \delta_{3A} \quad (6)$$

$$F = F_1 + F_2 + F_3 \quad (7)$$

Also, the speeds may be established using the following equations.

Initial engine start-up to $\omega_1$:

$$Mr\omega_1^2 = k_1 \delta_{10} \quad (8)$$

From rotational speed $\omega_1$ to rotational speed $\omega_2$:

$$Mr[\omega_2^2 - w_1^2] = k_1 \delta_{12} + k_2 \delta_{22} \quad (9)$$

From rotational speed $\omega_2$ to full speed $\omega_1$:

$$Mr[\omega_n^2 - \omega_2^2] = k_1 \delta_{13} + k_2 \delta_{23} + k_3 \delta_{33} \quad (10)$$

From Finite Element Analysis, the equivalent lobe stiffness is then calculated. From material properties and load sharing ratio, the displacement limits can then be established. The Finite Element Analysis provides the $k_1$, $k_2$, and $k_3$ variables, and $\delta_{1A}$, $\delta_{2A}$, and $\delta_{3A}$ are known from equations (1)-(3). Also, from equation (3), $\delta_{33}$ is also known. In this example, the designer assumes that:

$$\delta_{22} = \delta_{23} - \frac{1}{2}(\delta_{2A}) \quad (11)$$

Figure 7:
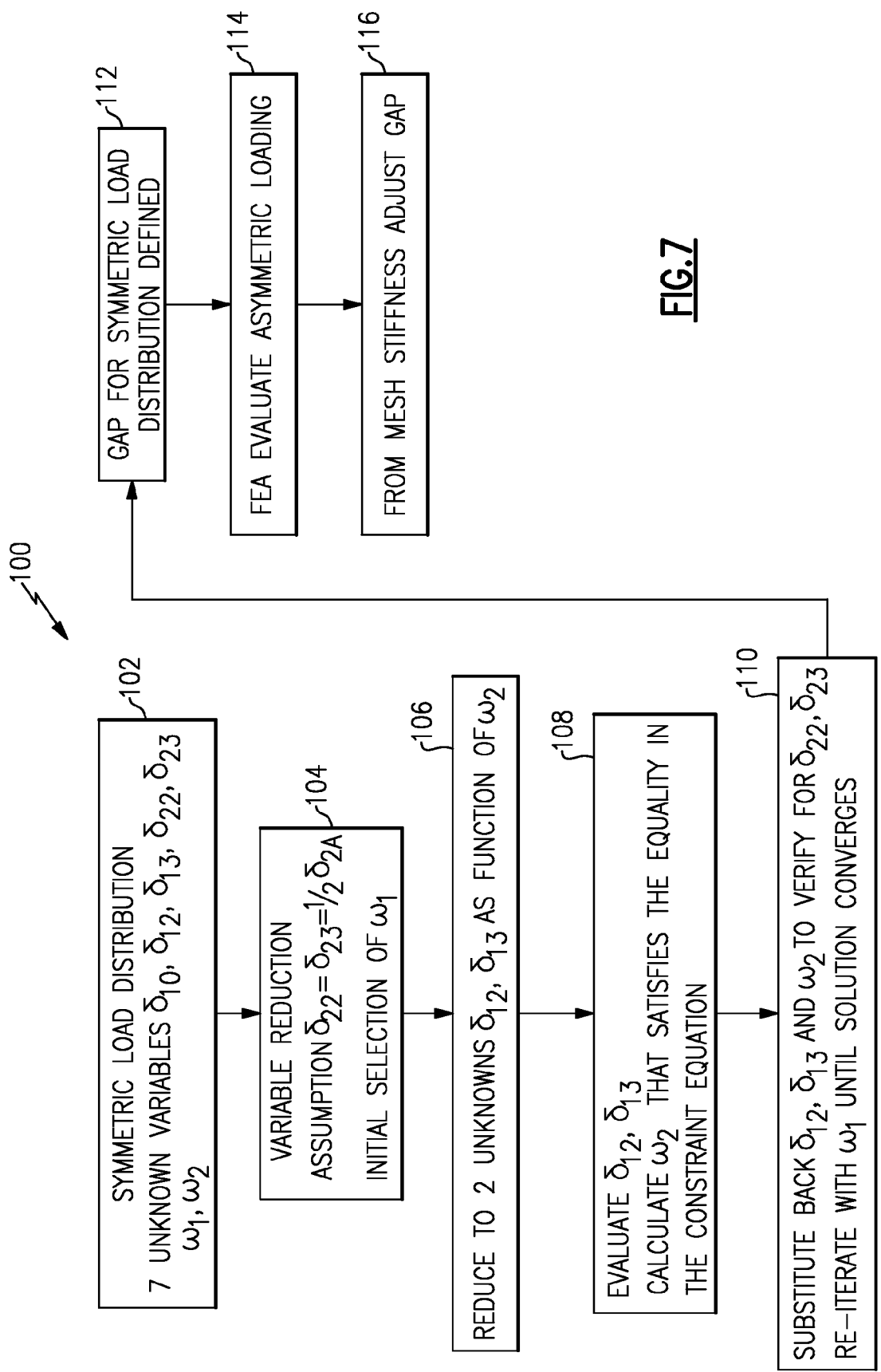
FIG. 7 shows an example method of designing the base and the disk of FIG. 4.

Referring now to a method 100 of FIG. 7, by utilizing the above techniques, the initial number of seven unknowns has been reduced to four unknowns ($\delta_{12}$, $\delta_{13}$, $\omega_1$ and $\omega_2$) at a step 102. The designer makes an estimate of $\omega_1$, ($\delta_{10}$ is defined in equation (8)) and then solves equations (9) and (10) for $\delta_{12}$ and $\delta_{13}$ as function of $\omega_2$ at a step 106 and a step 108, respectively. These variables $\delta_{12}$ and $\delta_{13}$ are then substituted back into equation (1) to re-solve for $\delta_{10}$ at a step 110. If equation (1) is satisfied (i.e., ($\delta_{1A}$-$\delta_{10}$-$\delta_{12}$-$\delta_{13}$)>o) then the displacements for the lobes 80c-80e have been established at a step 112.

In one example, Finite Element Analysis is then used to evaluate the asymmetric loading at a step 114, and the gaps may be readjusted as a result at a step 116.

Alternatively, in another example, the $\omega_2$ is obtained graphically. From manufacturing tolerances, the established gaps are greater than a minimum value and also gently load the bottom lobe at the start up, thus $\delta_{10}$ could be selected to be equal to or less than 20% of $\delta_{1A}$. The initial gap on the bottom-lobe is then determined. With this, $\omega_1$ is fixed and what left is to iterate for $\omega_2$ using equations (9) and (10).

Figure 8:
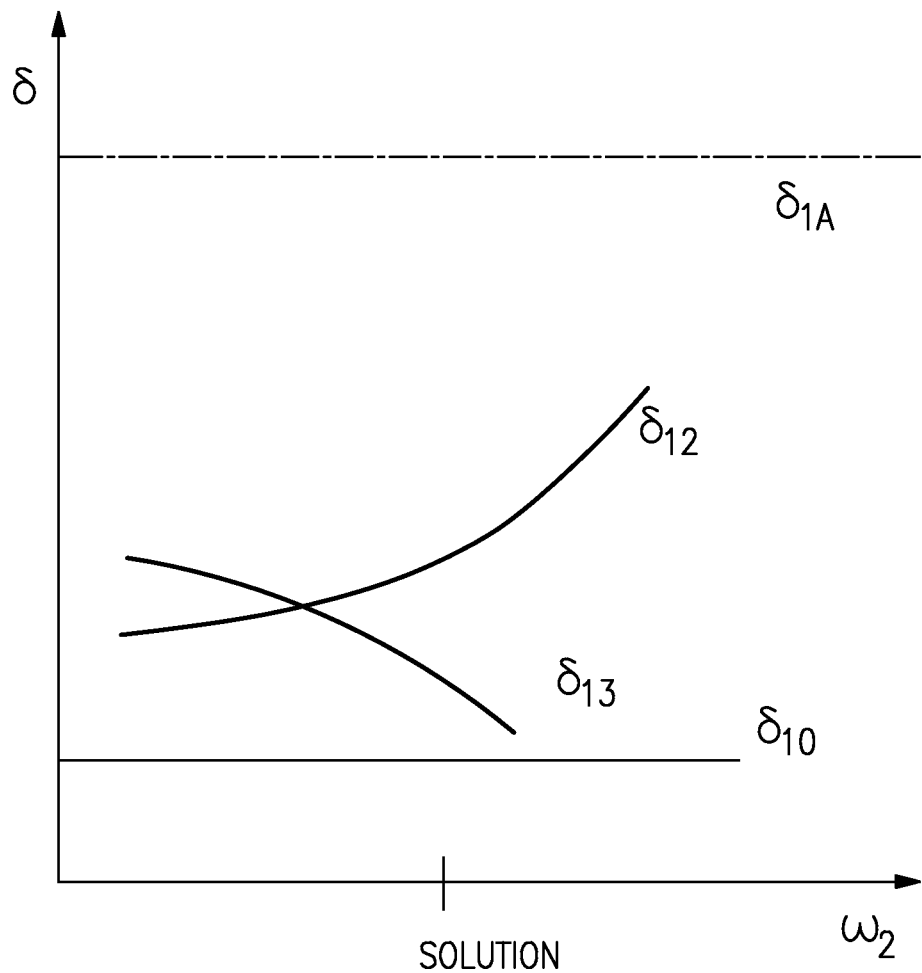
FIG. 8 shows a way of graphically determining a rotor angular velocity.

Referring to the example of FIG. 8, from Equations (9) and (10), a designer can plot $\delta_{12}$, $\delta_{13}$ verses $\omega_2$, plot $\delta_{1A}$ verses $\omega_2$ (horizontal line, upper bound), and plot $\delta_{10}$ verses $\omega_2$ (horizontal line). The solution to the speed $\omega_2$ is the speed $\omega_2$ that gives the sum of $\delta_{10} + \delta_{12} + \delta_{13}$ to be equal to $\delta_{1A}$.

Referring again to FIGS. 4-6A, combined with Finite Element Analysis, the loads on the lobes 80c-80d, and 80e-80f are proportional to the gaps 88c-88d, and the gaps 88e-88f. The Finite Element Analysis is carried out on the actual/physical disc-blade model and can take into consideration the effects of different imperfect design conditions such as tooling precision and for temperature and gas load effects. Thus, $C_1$ and $C_2$ are tuning/calibration factors. In one example, they are equal to unity. If the loading were symmetrical, the gaps 88a-88f could be determined as follows, where the proportionality constants $C_1$ and $C_2$ are determined by Finite Element Analysis calibration tuning:

$$\text{gaps } 88a\text{-}88b = 0 \quad (12)$$

$$\text{gaps } 88c\text{-}88d = C_1(\delta_{10}) \quad (13)$$

$$\text{gaps } 88e\text{-}88f = C_2(\delta_{10} + \delta_{12}) \quad (14)$$

Because the loading on the lobes 80a-80f is asymmetrical, the equations (12)-(14) are adjusted, as follows, to reestablish a balanced loading condition. In this example, Finite Element Analysis is used determine the imbalanced loads on each of the lobes 80a-80f.

The sizes of the gaps 88a-88e are then established using the following formulas (assuming the left side is higher: $F_L > F_R$ and $F_L - F_R = \Delta F$):

$$\text{gap } 88a = 0$$

$$\text{gap } 88b = \frac{1}{k_1}\left(\frac{F_1}{F}\right)\Delta F$$

$$\text{gap } 88c = C_1 \delta_{10}$$

$$\text{gap } 88d = \frac{1}{k_2}\left(\frac{F_2}{F}\right)\Delta F + C_1 \delta_{10}$$

$$\text{gap } 88e = C_2(\delta_{10} + \delta_{12})$$

$$\text{gap } 88f = \frac{1}{k_3}\left(\frac{F_3}{F}\right)\Delta F + C_2(\delta_{10} + \delta_{12})$$

Establishing the size of each gap 88a-88f individually accounts for unequal loading on the pressure and suction sides of the blade 34 and the leading and trailing edges.

Figure 9:
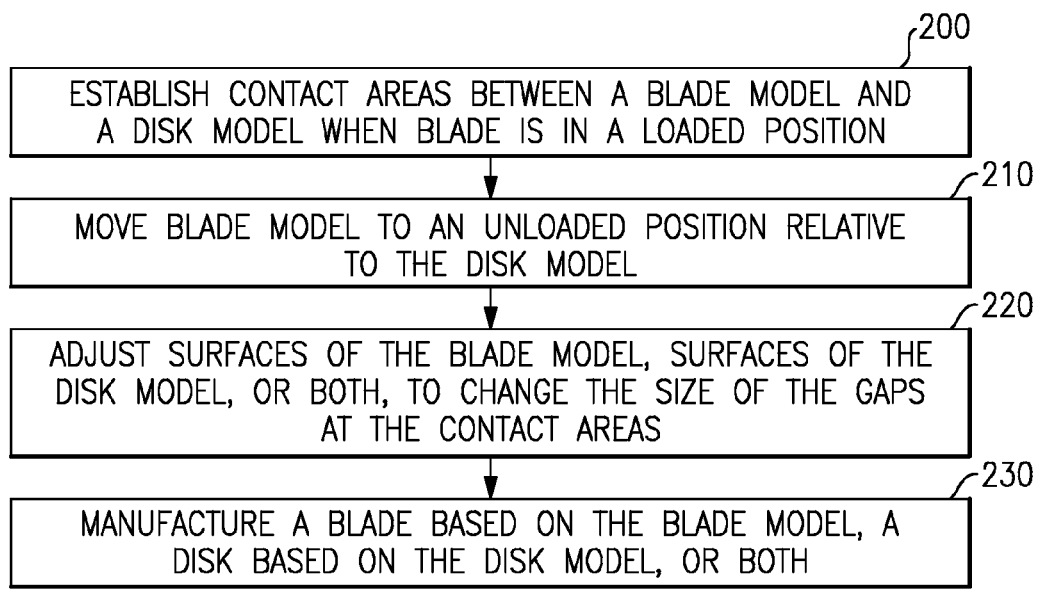
FIG. 9 shows a simplified method of designing the base and the disk of FIG. 4.

Referring to FIG. 9, a simplified example method of establishing an interface between a blade base and a disk includes a step 200 of establishing contact areas between a blade model and a disk model when the blade is in a loaded position. The blade model is then moved to an unloaded position relative to the disk model at a step 210. The surfaces are then adjusted at a step 220 so that the gaps at the contact areas vary in sizes. At a step 230, a blade is manufactured based on the blade model or a disk is manufactured based on the disk model.

Figure 10:
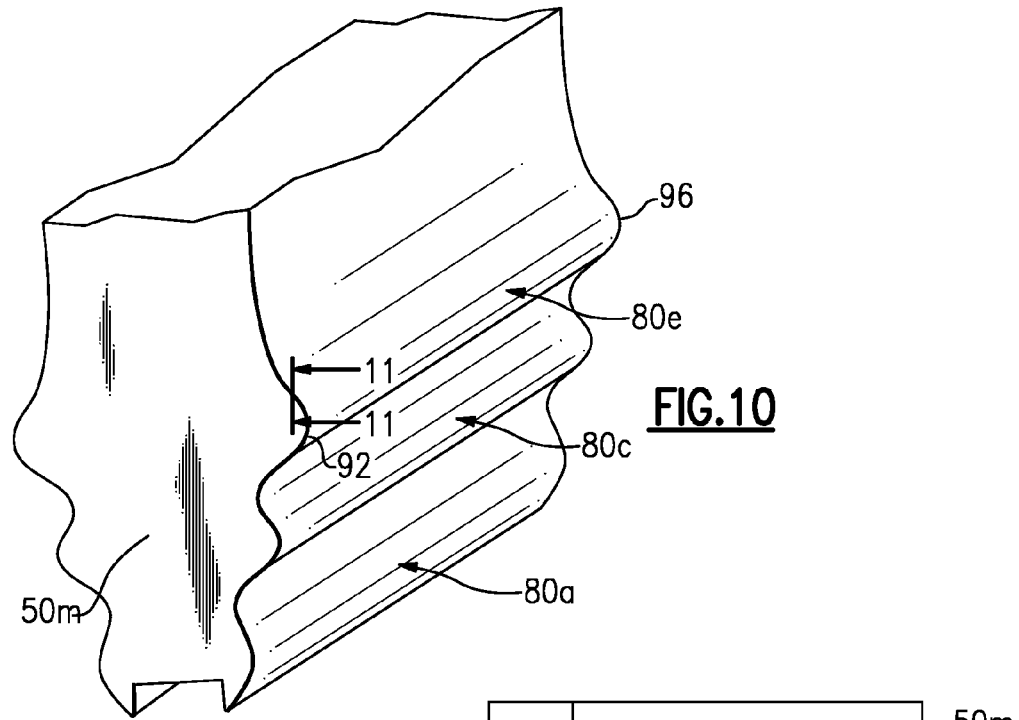
FIG. 10 shows a perspective view of a model of the FIG. 4 blade.
Figure 11:
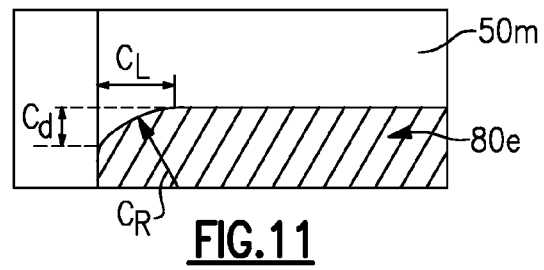
FIG. 11 shows a section view at line 11-11 in FIG. 10.

Referring now to FIGS. 10-11, in some examples, the operator also relieves stress concentrations by crowning the lobes 80a-80f of the base model 50$_m$. In this example, the lobes 80a-80f extend in a broach axis direction from a leading edge 92 of the base model 50$_m$ to a trailing edge 96 of the base model 50$_m$. Each of the lobes 80a-80f are crowned in this example. In another example, the disk 32m is crowned. The dimensions of the crown for one of the lobes 80a-80f depends on the load on that lobe 80a-80f.

The dimensions of the crown include a crown drop $C_d$, a crown radius $C_v$, and a crown length $C_1$. In this example, the crown drop $C_d$ for the leading edge of the lobe 80e is set up to be less than, or equal to, the differences in load distribution between the leading edge 92 and the trailing edge 96 of the lobes 80e and the stiffness k of the lobes 80e. The following equation represents how the crown drop $C_d$ may be established:

$$C_d \leq \frac{\text{ABS}(F_{LE} - F_{TE})}{k_i}$$

In this example, the subscripts $F_{LE}$ is the average load on the leading edge of the lobe 80e when the blade 34 is in the loaded position, and $F_{LE}$ is the average load on the trailing edge of the lobe 80e when the blade 34 is in the loaded position. The variable k represents the lobe stiffness, and ABS is the absolute value. A person having skill in this art would be able to determine the average loads at these positions using the modeling computer 56.

In this example, the crown length $C_1$ is greater than or equal to the length $C_d$, and the crown radius $C_r$ is greater than or equal to the crown drop $C_d$. Typically, $C_1$ (crown length)$\geq C_r$, and $C_r \geq 1.5\, C_a$.)

Features of the disclosed examples include a base of a turbomachine blade that has a relatively balanced load distribution without significantly increasing the size, complexity, and weight of the base or the disk.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

We claim:

1. A method of designing blade lobes of a turbomachine blade and corresponding disk lobes, comprising:
   determining, using a modeling computer, contact areas between a plurality of blade lobe surfaces on a blade model and a plurality of disk lobe surfaces on a disk model when the turbomachine blade is in a loaded position; and
   adjusting, using the modeling computer, at least one of the plurality of blade lobe surfaces, at least one of the plurality of disk model surfaces, or both, by moving the base model to an unloaded position; and
   influencing the base model, the disk model, or both to adjust the size of the gaps between the plurality of blade lobe surfaces and the plurality of disk lobe surfaces at the contact areas.

2. The method of claim 1, including manufacturing a blade based on the blade model.

3. The method of claim 2, including manufacturing a disk based on the disk model.

4. The method of claim 1, wherein gaps that are further from the axis are larger than the gaps that are closer to the axis.

5. The method of claim 1, wherein a base of the blade model is moveable radially within a recess of the disk model between the loaded position and the unloaded position.

6. The method of claim 1, including establishing a first radially extending contact path on a suction side of the blade model, the first radially extending contact path extending through at least some of the contact areas, wherein the plurality of the gaps that are on the suction side of the blade model are established along the radially extending contact path.

7. The method of claim 6, including establishing a second radially extending contact path on a pressure side of the blade model, the second radially extending contact path extending through at least some of the contact areas on a pressure side of the blade, wherein the plurality of gaps that are on the pressure side of the blade are established along the second radially extending contact path.

8. The method of claim 7, including using a transformation matrix to establish the first and the second radially extending contact path.

9. The method of claim 7, wherein the first radially extending contact path extends through an inner, a middle, and an outer blade fir-tree lobe on the suction side of the blade, and the second radially extending contact path extends through an inner, a middle, and an outer blade fir-tree lobe on the pressure side of the blade.

10. The method of claim 9, wherein a surface of the inner blade fir-tree lobe on the pressure side of the blade model is configured to contact the corresponding disk lobe when the blade model is in a loaded position and an unloaded position.

11. The method of claim 10, wherein the remaining contact surfaces are spaced from the corresponding disk lobe when the blade model is in the unloaded position.

12. The method of claim 1, wherein at least some of the plurality of blade lobes are axially crowned.

13. A method of designing blade lobes of a turbomachine blade and corresponding disk lobes, comprising:
    moving a blade from a loaded position to an unloaded position;
    spacing, using a modeling computer, a radially outer lobe of a the base of the blade away from a first corresponding contact area of a disk a first distance;
    spacing, using the modeling computer, a radially middle lobe of the base of the blade away from a second corresponding contact area of the disk a second distance; and
    spacing, using the modeling computer, a radially inner lobe of the base of the blade away from a third corresponding contact area of the disk a third distance,
    wherein the first distance is greater than the second distance and the second distance is greater than the third distance, and the blade is in an unloaded position during the spacing.

14. The method of claim 13, wherein the first corresponding contact area represents a first portion of the disk that is contacted by the radially outer lobe when the blade is loaded, the second corresponding contact area represents a second portion of the disk that is contacted by the radially middle lobe when the blade is loaded, and the third corresponding contact area represents a third portion of the disk that is contacted by the radially outer lobe when the blade is loaded.

15. The method of claim 13, including crowning a leading edge, a trailing edge, or both, of at least one of the radially outer lobe, the radially middle lobe, or the radially inner lobe.

16. A blade assembly, comprising:
    a base of a blade, the base configured to be installed within a recess and moved radially within the recess between a loaded position and an unloaded position; and
    a plurality of lobe surfaces on the base that each have a blade contact area that contacts a corresponding disk contact area on a disk when the base is in the loaded position, wherein a plurality of gaps are established between the blade contact areas and the disk contact areas when the base is moved to the unloaded position, wherein the size of the gaps varies, wherein gaps that are further from the axis are larger than the gaps that are closer to the axis;
    wherein a blade contact area of a radially inner blade lobe on the pressure side of the blade is configured to remain in contact with a disk contact area on a corresponding disk lobe when the blade base is in both a loaded position and an unloaded position.

17. The blade assembly of claim 16, wherein the gaps on a suction side of the blade are radially aligned along a first radially extending contact path that extends through at least some of the blade contact areas and at least some of the disk contact areas.

18. The blade assembly of claim 16, wherein the gaps on a pressure side of the blade are radially aligned along a second radially extending contact path that extends through at least some of the blade contact areas and at least some of the disk contact areas.

\* \* \* \* \*

UNITED STATES PATENT AND TRADEMARK OFFICE
CERTIFICATE OF CORRECTION

| | | |
|---|---|---|
| PATENT NO. | : 8,694,285 B2 | Page 1 of 1 |
| APPLICATION NO. | : 13/098651 | |
| DATED | : April 8, 2014 | |
| INVENTOR(S) | : Loc Quang Duong | |

It is certified that error appears in the above-identified patent and that said Letters Patent is hereby corrected as shown below:

IN THE CLAIMS:

In claim 1, column 9, line 34; replace *base* with --blade--

In claim 1, column 9, line 35; replace *base* with --blade--

Signed and Sealed this
Fourth Day of November, 2014

Michelle K. Lee
*Deputy Director of the United States Patent and Trademark Office*